United States Patent
Suga et al.

(10) Patent No.: US 6,451,875 B1
(45) Date of Patent: Sep. 17, 2002

(54) CONNECTING MATERIAL FOR ANISOTROPICALLY ELECTROCONDUCTIVE CONNECTION

(75) Inventors: Yasuhiro Suga; Motohide Takeichi, both of Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/680,713

(22) Filed: Oct. 6, 2000

(30) Foreign Application Priority Data

Oct. 12, 1999 (JP) .......................................... 11-289800

(51) Int. Cl.$^7$ ................................................ C08K 9/02

(52) U.S. Cl. ...................................... 523/204; 523/207

(58) Field of Search ................................. 523/204, 207

(56) References Cited

U.S. PATENT DOCUMENTS

| | | | |
|---|---|---|---|
| 5,804,882 A | | 9/1998 | Tsukagoshi et al. |
| 6,039,896 A | * | 3/2000 | Miyamoto et al. .......... 252/511 |

FOREIGN PATENT DOCUMENTS

| | | |
|---|---|---|
| EP | 4-30542 | 2/1992 |
| EP | 539 211 | 4/1993 |

OTHER PUBLICATIONS

"Electronic Polymers", Ken Gilleo, *Advanced Packaging*, Sep./Oct. 1994, pp. 37–38, 40 and 42.

* cited by examiner

Primary Examiner—Edward J. Cain
(74) Attorney, Agent, or Firm—Flynn, Thiel, Boutell & Tanis P.C.

(57) ABSTRACT

A connecting material for anisotropically electroconductive connection for bonding and connecting a semiconductor element having a plurality of electrodes recessed from the outer face of the passivation layer formed on the semiconductor element, on the one hand, with a substrate circuit board having a plurality of electrodes in a correspondingly confronted relation to the electrodes of the semiconductor element, on the other hand, which connecting material can afford to attain simultaneously a reliable mechanical bonding of the element with the circuit board and a secured electroconductive connection between the correspondingly confronted electrodes without suffering from damage of the passivation layer, even if the passivation layer is made of a resin. The connecting material (6) is made up of an adhesive component (7) of insulating property and electroconductive particles (8), wherein each of the electroconductive particles (8) is formed of a resin core particle (8*a*) coated with a metal layer (8*b*) and the average particle size d of the electroconductive particles (8) is at least 1.5 times the recessed depth h of the electrodes (4) from the outer face of the passivation layer (5) of the semiconductor element (3) and at most 0.5 time the distance s between the neighboring electrodes (4).

9 Claims, 2 Drawing Sheets

CONNECTING MATERIAL FOR ANISOTROPICALLY ELECTROCONDUCTIVE CONNECTION

FIELD OF THE INVENTION

The present invention relates to a connecting material for anisotropically electroconductive connection for bonding and connecting a semiconductor element having a plurality of electrodes recessed from the outer face of the passivation layer thereof with a substrate circuit board having a plurality of electrodes correspondingly confronting the electrodes of the semiconductor element.

DESCRIPTION OF THE RELATED TECHNIQUES

For assembling a semiconductor element, such as a bare chip or the like, on a substrate circuit board, the electrical connection and the mechanical bonding of them may be attained using an anisotropically electroconductive connecting material (in the following, sometimes referred to as ACM). Here, the semiconductor element and the circuit board are held in a posture in which the electrodes or terminals disposed on the semiconductor element and those on the circuit board are in a correspondingly confronted relationship with each other, whereupon the ACM is interposed therebetween. Then, the resulting assemblage is subjected to a heat-pressing to attain mechanical firm bonding of them and an assured electroconductive connection between the correspondingly confronted electrodes simultaneously, while keeping electrical insulation between neighboring electrodes. Semiconductor elements to be connected by such prior bonding practice are provided thereon with protruding electrodes as so-called bumps. The terminals or electrodes on the substrate circuit board are also in a form of protruding patterns. Therefore, the prior technique for bonding and connecting semiconductor elements with a substrate circuit board has been contrived to connect such protruding electrodes with each other.

The recent trend to form electric and electronic assemblies with narrower electrode intervals made with electrodes difficult to be formed as bumps, so that a technique has been proposed to assemble a semiconductor element having electrodes which do not protrude out of the face of the semiconductor element, as dissimilar to the bump, directly on a substrate circuit board. Since such a bumpless semiconductor element is provided with electrodes which recede from the outer face of the passivation layer of the element, it is required to contrive an anisotropically electroconductive connecting material which permits the establishment of an assured connection of the correspondingly confronted electrodes with each other under such a condition.

For meeting such a requirement, an anisotropically electroconductive connecting material comprising electroconductive particles having a hardness lower than that of the passivation layer but higher than that of the electrodes has been proposed in Japanese Patent Kokai Hei 4-30542, in which nickel particles are used as the electroconductive particles. However, the material of the passivation layer harder than nickel is thereby restricted and this prior art connecting material cannot be used for connecting a semiconductor element having a passivation layer made of a resin, such as a polyimide.

SUMMARY OF THE INVENTION

The object of the present invention is to provide a connecting material for anisotropically electroconductive connection for bonding and connecting a semiconductor element provided thereon with a passivation layer and having a plurality of electrodes recessed from the outer face of the passivation layer formed on the semiconductor element, on the one hand, with a substrate circuit board having a plurality of electrodes, on the other hand, wherein said connecting material can attain simultaneously a reliable mechanical bonding and an assured electroconductive connection between the correspondingly confronted electrodes without suffering from damage of the passivation layer even in the case where a semiconductor element has a resin passivation layer, while maintaining electrical insulation between the neighboring electrodes.

Thus, the present invention resides in the following connecting material for anisotropically electroconductive connection:

(1) A connecting material for anisotropically electroconductive connection for bonding and connecting a semiconductor element having a plurality of electrodes recessed from the other face of the passivation layer formed on the semiconductor element, on the one hand, with a substrate circuit board having a plurality of electrodes in a correspondingly confronted relation to the electrodes of the semiconductor element, on the other hand, comprising an adhesive component of insulating property and electroconductive particles, wherein each of the electroconductive particles comprises a resin core particle coated with a metal layer and the average particle size of the electroconductive particles is at least 1.5 times the recessed depth of the electrode from the outer face of the passivation layer of the semiconductor element.

(2) The connecting material as defined in the above (1), wherein the average particle size of the electroconductive particles is at most 0.5 time the distance between the neighboring electrodes.

(3) The connecting material as defined in the above (1) or (2), wherein the metal coating layer on the resin core particle of each of the electroconductive particles is further coated with an insulating resin.

(4) The connecting material as defined in any one of the above (1) to (3), wherein the hardness (K-value) of the electroconductive particle is in the range from 500 to 10,000 N/mm$^2$.

(5) The connecting material as defined in any one of the above (1) to (4), wherein the Mohs hardness of the metal coating layer of the electroconductive particle is in the range from 1 to 6.

DETAILED DESCRIPTION OF THE DISCLOSURE

Figure 1:
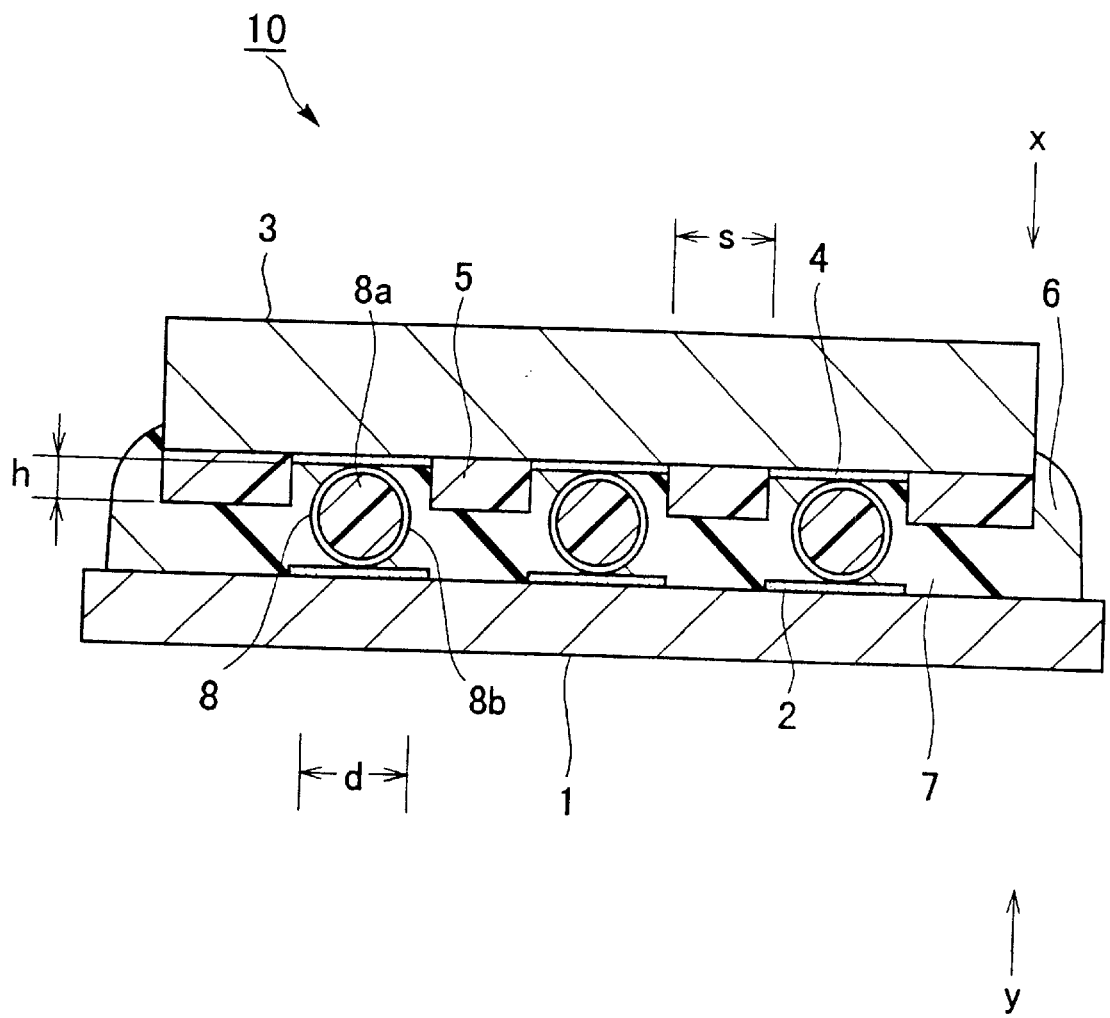
FIG. 1 shows the state of connection of a semiconductor element and a substrate circuit board by the connecting material according to the present invention in an explanatory sectional illustration.

One of the elements to be connected using the connecting material for anisotropically electroconductive connection according to the present invention is a semiconductor element having a plurality of electrodes recessed from the outer face of the passivation layer formed on the semiconductor element. For such a semiconductor element, there may be exemplified those in which the electrodes have no protrusion, such as a bump, as in the case of a so-called bumpless IC. Such a semiconductor element has a passivation layer surrounding the electrodes, wherein the electrodes are recessed from the outer face of the passivation layer. The passivation layer may in general be made of a resin, such as a polyimide, polybenzocyclobutene or polyfluoroethylene (TEFLON). The electrode on the semiconductor element may usually be made of aluminum, copper or the like. If the electrode is made of aluminum, an oxide film is formed on the surface. As the semiconductor elements, freely exposed chips, called bare chips, may be used, which are connected to a substrate circuit board face-down.

The other element to be connected with the semiconductor element is a substrate circuit board which has an electric circuit pattern having provided thereon with a plurality of electrodes disposed in a correspondingly confronted relation to the electrodes of the semiconductor element. The substrate circuit board may be a board of glass, resin or composite, such as glass/epoxy, or a flexible board made of a resin, such as a polyimide resin or the like, on which electrodes of a commonly used electrical conductor, such as copper, silver, aluminum or the like, are disposed.

The connecting material for anisotropically electroconductive connection for bonding and connecting the semiconductor element and the substrate circuit board comprises an insulating adhesive component containing a thermosetting resin and electroconductive particles. The connecting material is interposed between the elements to be connected together and the elements are pressed onto each other from both sides so as to cause the electrodes disposed opposingly on the confronting face of each element to be brought into contact with the electroconductive particles bridging between the elements, while holding the thermosetting resin between neighboring electrodes with the electroconductive particles dispersed therein.

For the main resin of the thermosetting resin contained in the insulating adhesive component of the connecting material according to the present invention, there may be used without restriction any kind of resin capable of curing by heating or by the action of irradiation of a ray, such as UV ray, under concurrent use of a hardening agent, for example, epoxy resins, urethane resins, phenol resins, hydroxyl group-containing polyester resins and hydroxyl group-containing acrylic resins, wherein particular preference is given to epoxy resins in view of the balance among the curing time, curing temperature, storage stability and so on. As the epoxy resins, there may be recited, for example, bisphenol type epoxy resins, epoxy novolak resins and resins based on epoxy-compounds having two or more oxirane groups in the molecule. Resins based on radical polymerization may also be used for the thermosetting resin. Commercial products may be employed as such therefor.

The main resin of the thermosetting resin mentioned above can be subjected to the curing reaction usually by concurrent use of a hardening agent, while use of a hardening agent may be dispensed with when functional group(s) participating in the curing reaction are present in the molecule of the main resin. For the hardening agent, there may be employed those which can react with the main resin to cause the curing by heating, by a light irradiation or so on, for example, imidazole, amines, acid anhydrides, hydrazides and dicyandiamide as well as modified products of them. Commercial products may be employed. For such a hardening agent, preference is given to a latent hardening agent.

A latent hardening agent will not cause a curing reaction during the processing operations and storage at normal temperature and during the drying operation at relatively lower temperatures (40–80° C.) but will be subjected to a curing reaction under pressure with heating at the curing temperature (heat-pressing) or by the action of irradiation of a light, such as UV rays. For such a latent hardening agent, special preference is given to a product in which the above-mentioned hardening agent, such as an imidazole or an amine, is encapsulated in microcapsules, for which commercial products may be used as such. In the case of heat activation, those exhibiting a curing initiation temperature of 80–150° C. may favorably be used.

According to the present invention, the adhesive component of the connecting material may contain a thermoplastic polymeric material, in order to impart to the connecting material an ability for being coated on a substrate or for film-forming. For such thermoplastic polymeric materials, there may be employed, for example, phenoxy resins, polyester resins, acrylic resins, NBR and SBR.

The adhesive component of the connecting material according to the present invention may further contain other additives, such as a surfactant, coupling agent, antioxidant and so on.

The proportion of these ingredients to be added to the adhesive component may be 0 to 40%, preferably 1 to 30%, based on the weight of the thermosetting resin, for the thermoplastic polymer material, and 0 to 10%, preferably 1 to 5%, based on the total sum weight of the resinous constituents, for other additives.

The electroconductive particles to be compounded together with the adhesive component in the connecting material according to the present invention are electrical conductor-coated particles in which resin core particles are coated with an electroconductive material by plating or the like. The electroconductive particles may further be covered by an insulating resin coating layer. The electroconductive particles may be contained in the connecting material in a proportion of 2–40%, preferably 5–25%, based on the volume of the adhesive component.

For the resin core particles constituting the electroconductive particles, there may be employed particles of, for example, synthetic resins, such as epoxy resins, styrene resins, silicone resins, acrylic resins, acrylic/styrene resins (copolymer resins of an acrylate and styrene), polyolefin resins, melamine resin and benzoguanamine resin; divinylbenzene-cross-linked resins; synthetic rubbers, such as NBR and SBR; and mixtures of them. Among them, preference is given to styrene resins, acrylic resins, acrylic/styrene resins, benzoguanamine resin and divinylbenzene-cross-linked resins. The hardness and the elastic modulus of the polymer resin core particle are not specifically limited and may adequately be chosen for each specific case.

For the metal layer covering the core resin particle, one or more metals among nickel, gold, copper, silver and so on may be employed, wherein preference is given to nickel. Such a metal may favorably be plated on the polymer resin core particle by electroless plating or electroplating in a layer. The plated metal layer may favorably have a thickness in the range from 5 to 300 nm, preferably from 10 to 200 nm. A particular preference is given to a plated metal in which gold is plated on a base nickel plating layer, wherein the thickness of the base nickel plating layer may be in the range from 10 to 300 nm, preferably from 30 to 200 nm, and the thickness of the gold plating layer may be in the range from 5 to 100 nm, preferably from 10 to 30 nm.

When the electroconductively metal-plated particles are coated with an insulating resin layer, the insulating resin should be insoluble or difficultly soluble in the insulating adhesive component of the connecting material and melt or be destroyed when the connecting material is subjected to heat-pressing, in order to permit to build up a frictional direct contact of the plated metal layer with the correspondingly confronted electrodes. While every insulating resin permitting such a condition can be used therefor without any restriction, use of an acrylic resin, styrene resin or acrylic/styrene resin is preferred.

The insulating resin may preferably cover the metal-plated particle surface to form an insulating layer, wherein a particular preference is given to an insulating layer made of a cross-linked acrylic resin, a cross-linked styrene resin or a cross-linked acrylic/styrene resin.

The thickness of the insulating resin coating layer may favorably be in the range from 0.05 to 2 μm, preferably from 0.1 to 0.5 μm.

According to the present invention, the electroconductive particles described above should meet the condition that the average particle size (d) thereof is at least 1.5 times, preferably 1.5 to 5 times, the recessed depth (h) of the electrodes from the outer face of the passivation layer of the semiconductor element. The electroconductive particles to be used according to the present invention exhibit, due to the structure of the particle composed of a resilient resin core and a metal layer coated thereon, an elasticity to permit deformation when pressed between the confronted electrodes. Therefore, a deformation for building up sufficient electroconductive contact with the electrode can be attained when the average particle size, i.e. particle diameter, is at least 1.5 times the recessed depth (h) of the electrodes from the outer face of the passivation layer of the semiconductor element, whereas sufficient electroconductive connection may not be attained when the average particle size is only a little greater than the recessed depth (h) of the electrodes.

According to the present invention, it is favorable that the average particle size (d) of the electroconductive particles is not greater than 0.5 time, preferably from 0.01 to 0.5 time, the distance between the neighboring electrodes. In the interstitial space between two neighboring electrodes, possible contact of the electroconductive particles in the lateral direction upon the heat pressing may give birth to a possibility of short-circuiting between the electrodes in case the particle size is large. By restricting the average particle size as above, the above short-circuiting danger is avoided.

The electroconductive particles according to the present invention may favorably have a hardness (K-value) in the range from 500 to 10,000 N/mm², preferably from 1,000 to 8,000 N/mm². By adjusting the hardness (K-value) of the electroconductive particles at a value in the above prescribed range, possible damage of the passivation layer constituted of a resin, such as a polyimide resin, which is liable to be damaged by metal particles, on the semiconductor element caused by the particles is prevented.

Below, the definition of K-value is explained:

According to the "Theory of Elasticity" in Landau-Riffschitz's Theoretical Physics Curriculum, issued from Tokyo Tosho on 1972, on page 42, problems of contact between two elastic spherical bodies having each a radius of R and R' are dealt with by the following equations:

$$h = F^{2/3}[D^2\{(1/R)+(1/R')\}]^{1/3} \quad (1)$$

$$D = (3/4)[\{(1-\sigma^2)/E\}+\{(1-\sigma'^2)/E'\}] \quad (2)$$

In the above equations, he denotes the difference between the distance (R+R') and the distance between the centers of the two spheres, F represents the compressive force, E and E' each represent the elasticity of each of the elastic spheres and a and a' each represent the Poisson ratio of each of the elastic spheres.

An approach to the case of contact between a spherical body and a plate under pressing the sphere onto the plate surface may be possible by applying the above theoretical treatment by assuming that R'→∞ and E>>E', whereby the following approximation equation is obtained:

$$F = (2^{1/2}/3) \cdot (S^{3/2}) \cdot (E \cdot R^{1/2}) \cdot (1-\sigma^2) \quad (3)$$

in which S represents the magnitude of deformation by pressing.

The K-value is defined by the equation $$K = E/(1-\sigma^2) \quad (4)$$

It follows from the equations (3) and (4)

$$K = (3/\sqrt{2}) \cdot F \cdot S^{-3/2} \cdot R^{-1/2} \quad (5)$$

Thus, the K-value represents the hardness of a spherical body in a universal and quantitative expression. Therefore, the hardness of a microparticle can be represented definitely and quantitatively using the K-value.

Figure 2:
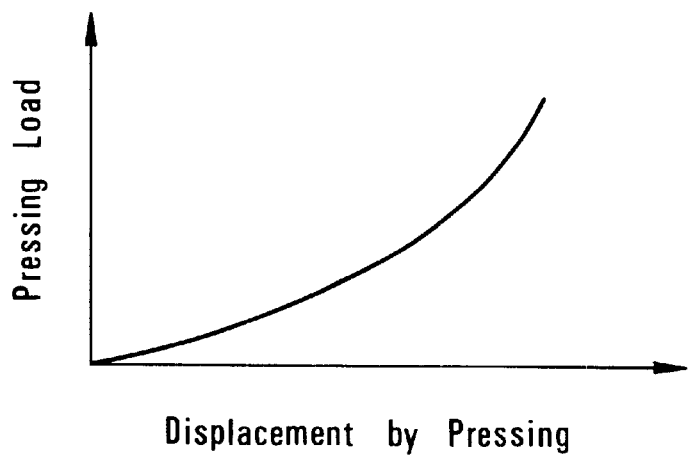
FIG. 2 is a graph showing the relationship between the displacement by pressing and the pressing load for electroconductive particles.

The K-value of an elastic spherical body can be determined in the following manner:

A particulate substance to be inspected present as spherical particles is scattered over a steel plate and one particle is chosen a the objective sample among those scattered over the surface of the steel plate. The sample particle is pressed onto the surface of the steel plate by a flat end face of a thin diamond rod having a diameter of 50 μm on a powder compression tester (for example, Model PCT-200 of Shimadzu Corporation). The pressing load is detected by converting it into an electromagnetic signal and the displacement due to pressing is detected by converting it into an electric signal using a differential transformer. In this manner a relationship between the pressing load and the displacement by pressing is obtained as shown in FIG. 2 illustratively. From this curve as shown in FIG. 2, the load at 10% pressing strain and the pressing displacement for the sample particle can be determined.

Figure 3:
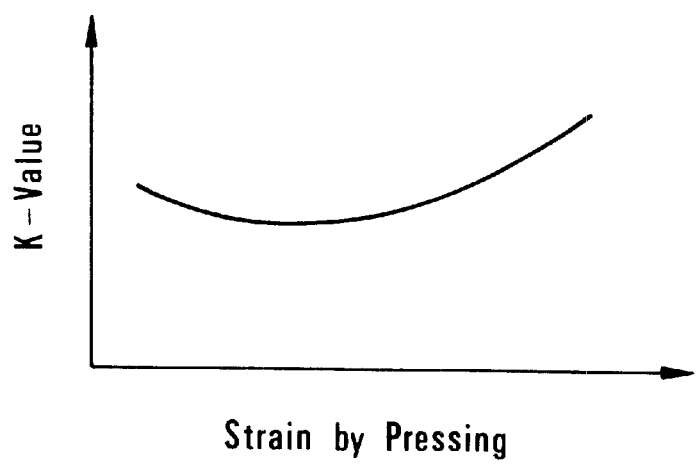
FIG. 3 is a graph showing the relationship between the K-value and the strain by pressing for electroconductive particles.

From these observed values in combination with equation (5), the relationship between the K-value and the pressed strain can be deduced, which is shown in FIG. 3 illustratively. Here, the value for the strain by pressing is a quotient of the pressing displacement by the diameter of the sample particle expressed by percent. The conditions for this determination are:

Pressing rate: The load is increased in a constant loading rate pressing at a rate of 2.7 mN per second.

Testing load: Maximum 100 mN

Test temperature: 20° C.

When an electrode material, such as aluminum, which forms an insulating film such as oxide film on the surface, is used for the electrode of the semiconductor element, a defective electroconductive connection may occur by the insulating film formed on the electrode. Such a defect can be avoided by using electroconductive particles coated thereon with a metal layer having a hardness higher than that required for breaking down the insulating film. Here, the metal layer should not damage the passivation layer on the semiconductor element. Therefore, the metal layer on the electroconductive particles according to the present invention should have a Mohs hardness of 1–6, preferably 2–4.

The connecting material according to the present invention may be provided as a product in a form of a paste or a sheet. The connecting material in the form of paste may be prepared without using any solvent by selecting adequate constituent components among those described previously, while it is practical in general to dissolve or disperse the components in a suitable solvent to form a paste. As the solvent, there may be employed alcohols, ketones, esters, ethers, phenols, acetal and nitrogen-containing hydrocarbons, among which toluene, MEK, ethyl acetate and cellosolve acetate may be exemplified. The amount of the solvent to be used may in general be in the range of about 20–40%, based on the weight of the resinous ingredients of the connecting material.

For preparing the connecting material according to the present invention in the form of a sheet, the paste prepared as above is coated on an exfoliative film in a layer, whereupon the solvent is volatilized off to form a sheet of the connecting material.

The connecting material according to the present invention is placed in between the substrate circuit board and the semiconductor element, both being provided on the opposing face with a plurality of electrodes in a correspondingly confronted relation, whereupon the resulting assemblage is heat-pressed by pressing the assemblage from both sides with heating. In the case of the connecting material of paste, the semiconductor element and the circuit board are coated with this paste over the region to be bonded together including the electrodes and the two are put together after drying or without drying, whereupon the resulting assemblage is heat-pressed to cause the material to be heat-set. In the case of connecting material of a sheet, it is placed in between the circuit board and the semiconductor element and the resulting assemblage is heat-pressed to cause the connecting material to be cured. The curing of the connecting material may also be effected by irradiation of a ray, such as a UV ray.

In the connecting process step given above, the connecting material is interposed between the circuit board and the semiconductor and the resulting assembly is heated with pressing to cause the resinous ingredients of the connecting material to first melt and then be expelled aside to fill up the free space between the neighboring electrodes, while the electroconductive particles retained in between the confronting electrodes are seized by these electrodes by being pressed thereonto to bridge electroconductively therebetween, before the thermosetting resin in the connecting material is heat-set to build up a solid connected assembly. In this manner, the electrical connection between the confronting electrodes and the mechanical bonding of the substrate board with the semiconductor element are attained at the same time, while maintaining the electrical insulation between the neighboring electrodes. By the use of the connecting material according to the present invention, the mechanical bonding and the electrical connection can be realized properly even when a semiconductor element having electrodes recessed from the outer face of the passivation layer is connected with a substrate circuit board.

The resulting connected assembly of a substrate circuit board and a semiconductor element is not subject to damage of the passivation layer, even when made of a resin, and can afford the electroconductive connection of an electrode which is recessed from the outer face of the passivation layer with the confronted electrode on the substrate circuit board in an assured way. In this manner, superior mechanical bonding and a reliable electroconductive connection are attained, permitting the exclusion of the occurrence of defective electrical connection between the electrodes for a long period of time.

As described above, a connected assembly superior in bonding strength, reliability of electroconductive connection and preservation of electrical insulation can be produced by using the connecting material according to the present invention, since the connecting material comprises, on the one hand, an adhesive component containing a thermosetting resin and, on the other hand, electroconductive particles made of polymer resin core particles coated with a metal layer, wherein the average particle size of the electroconductive particles is chosen to be at least 1.5 times the recessed depth of the electrodes from the outer face of the passivation layer of the semiconductor element.

A possible occurrence of defective electrical connection due to short-circuiting between neighboring electrodes will be excluded by selecting the average particle size of the electroconductive particles to be at most 0.5 time the distance between the neighboring electrodes. This is further facilitated by the technical measure of coating the metal surface of the electroconductive particle with an insulating resin. A possible damage of the passivation layer on the semiconductor element may efficiently be prevented by selecting the electroconductive particles having a specific K-value hardness. A better electroconductive connection between the confronted electrodes can be reached by using electroconductive particles coated with a metal layer having a specific Mohs hardness, even if an insulating film is formed on the electrode surface.

THE BEST MODE FOR EMBODYING THE INVENTION

Below, the present invention is described by an embodiment with reference to the appended drawing.

FIG. 1 is an explanatory illustration showing the principle of connection of a semiconductor element with a substrate circuit board under connection of the correspondingly confronted electrodes by the connecting material according to the present invention in a schematic sectional view, in which only a few electroconductive particles 8 are shown in an enlarged illustration for the sake of ease of understanding.

In FIG. 1, a substrate circuit board 1 having a plurality of electrodes 2 is connected with a semiconductor element 3, such as an IC chip, having a plurality of electrodes 4 and provided, surrounding these electrodes, with a passivation layer 5 made of a polyimide resin, by placing a sheet of the connecting material 6 therebetween. The electrode 4 is recessed from the outer face of the passivation layer 5 with a recessed depth h. The electrodes 2 and the electrodes 4 are in a correspondingly confronted relation under interposition of the connecting material 6 prepared in a form of a sheet therebetween. The connecting material 6 is composed of an insulating adhesive component 7 containing a thermosetting resin and electroconductive particles 8. When a connecting material in a form of a paste is used, this is applied to the substrate circuit board 1. The electroconductive particle 8 has a structure in which a resin core particle 8a is coated with a metal layer 8b. The average particle size d of the electroconductive particles 8 is at least 1.5 times the recessed depth h of the electrodes 4 from the outer face of the passivation layer 5 and is at most 0.5 time the distance s between the neighboring electrodes 4.

For effecting connection of the semiconductor element with the substrate circuit board, the connecting material 6 is placed on the substrate circuit board 1 so as to cover the extend to be bonded, whereon the semiconductor element 3 is placed in such a manner that each of the electrodes thereof confronts the corresponding counter electrode of the substrate circuit board 1. The resulting assemblage is then heat-pressed by pressing the assemblage from both sides as indicated by the arrows X and y while heating the connecting material 6. The adhesive component 7 of the connecting material 6 first melts and then is expelled aside to fill up the free space between the substrate circuit board and the semiconductor element, before the thermosetting resin of the adhesive component is heat-set to establish mechanical bonding therebetween to build up the solid connected assembly 10. The electroconductive particles 8 are seized under compression between the correspondingly confronted electrodes 2 and 4 to bridge them electroconductively to build up an assured electrical connection therebetween while keeping a reliable electrical insulation between the neighboring electrodes (2 and 2 or 4 and 4).

Here, damage of the passivation layer 5 by the electroconductive particles 8 can be prevented, since the electroconductive particles 8 have a K-value hardness in the range mentioned above. An assured electroconductive connection between the confronted electrodes 2 and 4 is attained by a reliable frictional press-contact due to compressive deformation of the electroconductive particles bridging therebetween, since the average particle size d is at least 1.5 times the recessed depth h of the electrode 4 from the outer face of the passivation layer 5. When the electrodes (2, 4) are made of an electrode material subject to formation of an insulating film, such as an oxide film thereon, electroconductive connection can be attained by breaking down such an insulating film by pressing the electroconductive particles having a Mohs hardness in the range defined above onto the electrode. The electrodes (2, 4) are held insulated between neighboring electrodes (2 and 2 or 4 and 4), since the electroconductive particles 8 are each dispersed isolately in the insulating adhesive component 7 of the connecting material in the interspace between the neighboring electrodes under exclusion of lateral direct contact of the particles with each other due to the restriction of the average particle size d to at most 0.5 time the distance s between the neighboring electrodes.

EXAMPLES

Below, the present invention is described by way of examples.

Example 1

To a thermosetting mixture of an insulating adhesive component obtained by mixing 50 parts by weight of an epoxy resin (a product of Yuka-Shell Epoxy K. K. with tradename Epikote 1009) and 45 parts by weight of a latent hardening agent (a product of Asahi-Dow K. K. with tradename HX 3721), 5 parts by weight of electroconductive particles (a product of Nippon Chemical Industrial Co., Ltd., with an average particle size d=5 $\mu$m and a K-value hardness of 7,490 N/mm$^2$), each made of a core particle of a benzoguanamine resin plated thereon with nickel, were admixed and were dispersed therein uniformly, whereupon the mixture was processed into a sheet of a thickness of 20 $\mu$m of an anisotropically electroconductive connecting material.

This sheet was interposed between an IC chip provided thereon with electrodes having an aluminum surface and a thickness of 1 $\mu$m (with a surface area of 6.3 mm$^2$, h=1.4 $\mu$m, s=100 $\mu$m) and a substrate circuit board of glass/epoxy resin (having electrodes of a thickness of 18 $\mu$m made of copper plated with nickel/gold), whereupon the resulting assemblage was heat-pressed at 180° C. at a pressing force of 150 N for 20 seconds. A better electroconductive connection was attained, wherein the continuity resistance determined directly after building up of connection by the heat pressing was 5–10 m$\Omega$ per one terminal with an insulation resistance between neighboring electrodes of not lower than $10^8 \Omega$.

Example 2

To the thermosetting mixture of the insulating adhesive component as used in Example 1, 5 parts by weight of electroconductive particles of the same particle structure as those used in Example 1 but having a different average particle size (a product of Nippon Chemical Industrial Co., Ltd., with an average particle size of 3 $\mu$m) were admixed and dispersed therein uniformly, whereupon the mixture was processed into a sheet of connecting material of a thickness of 20 $\mu$m. This sheet was interposed between an IC chip and a substrate circuit board of the same specifications as those used in Example 1, whereupon the resulting assemblage was heat-pressed under the same condition as in Example 1. A better electroconductive connection was attained, wherein the continuity resistance of the resulting connected assembly determined directly after building up of the connection by the heat pressing was 5–10 m$\Omega$ per one terminal with an insulation resistance between neighboring electrodes of not lower than $10^8 \Omega$.

Example 3

To the thermosetting mixture of the insulating adhesive component as used in Example 1, 5 parts by weight of electroconductive particles of the same particle structure as those used in Example 1 but having a different average particle size (a product of Nippon Chemical Industrial Co., Ltd., with an average particle size of 10 $\mu$m) were admixed and dispersed therein uniformly, whereupon the mixture was processed into a sheet of connecting material of a thickness of 20 $\mu$m. This sheet was interposed between an IC chip and a substrate circuit board of the same specifications as those used in Example 1, whereupon the resulting assemblage was heat-pressed under the same condition as in Example 1. A better electroconductive connection was attained, wherein the continuity resistance of the resulting connected assembly determined directly after building up of the connection by the heat pressing was 5–10 m$\Omega$ per one terminal with an insulation resistance between neighboring electrodes of not lower than $10^8 \Omega$.

Example 4

To the thermosetting mixture of the insulating adhesive component as used in Example 1, 5 parts by weight of electroconductive particles of the same particle structure as those used in Example 1 but having a different average particle size (a product of Nippon Chemical Industrial Co., Ltd., with an average particle size of 20 $\mu$m) were admixed and dispersed therein uniformly, whereupon the mixture was processed into a sheet of connecting material of a thickness of 20 $\mu$m. This sheet was interposed between an IC chip and a substrate circuit board of the same specifications as those used in Example 1, whereupon the resulting assemblage was heat-pressed under the same condition as in Example 1. A better electroconductive connection was attained, wherein the continuity resistance of the resulting connected assembly determined directly after building up of the connection by the heat pressing was 5–10 m$\Omega$ per one terminal with an insulation resistance between neighboring electrodes of not lower than $10^8 \Omega$.

Example 5

The sheet of anisotropically electroconductive connecting material prepared in Example 1 was interposed between an IC chip provided thereon with electrodes having a gold surface and a thickness of 1 μm (with surface area of 6.3 mm³, h=1.4 μm, s=100 μm) and a substrate circuit board of glass/epoxy resin provided thereon with electrodes of a thickness of 18 μm made of copper plated with nickel/gold, whereupon the resulting assemblage was heat-pressed at 180° C. for 20 seconds while pressing at 150 N. A better electroconductive connection was attained, wherein the continuity resistance of the resulting connected assembly determined directly after building up of the connection by the heat pressing was 3–8 mΩ per one terminal with an insulation resistance between neighboring electrodes of not lower than $10^8 \Omega$.

Comparative Example 1

To the thermosetting mixture of the insulating adhesive component as used in Example 1, 5 parts by weight of nickel particles of indeterminate form (a product of the firm Inko with particle sizes not greater than 5 μm and a K-value hardness of 40,000 N/mm²) were admixed and dispersed therein uniformly, whereupon the mixture was processed into a sheet of connecting material of a thickness of 20 μm. This sheet was interposed between an IC chip and a substrate circuit board of glass/epoxy resin of the same specifications a those used in Example 1, whereupon the resulting assemblage was heat-pressed under the same condition as in Example 1. A disconnection failure occurred due to destruction of the circuit of the IC chip by the nickel particles piercing through the passivation layer. No better electroconductive connection was attained, wherein the continuity resistance observed was unstable and fluctuated greatly within the range from 5 to 1,000 mΩ.

Comparative Example 2

To the thermosetting mixture of the insulating adhesive component as used in Example 1, 5 parts by weight of metal particles of a gradient alloy (a product of Asahi Chemical Industry Co., Ltd. with an average particle size of 5 μm and a K-value hardness of 20,000 N/mm²) were admixed and dispersed therein uniformly, whereupon the mixture was processed into a sheet of connecting material of a thickness of 20 μm. This sheet was interposed between an IC chip and a substrate circuit board of glass/epoxy resin of the same specifications as those used in Example 1, whereupon the resulting assemblage was heat-pressed under the same condition as in Example 1. A disconnection failure occurred due to destruction of the circuit of the IC chip by the gradient alloy particles piercing through the passivation layer. No better electroconductive connection was attained, wherein the continuity resistance was able to be detected within the range from 5 to 1,000 mΩ, though it was impossible to determine for most of the terminals.

From the results of the above Examples and Comparative Examples, it is seen that the IC chip and the substrate circuit board can be connected with better mechanical bonding and better electroconductive connection by using electroconductive particles of a particle structure in which a resin core particle is coated with a metal layer having an average particle size d of at least 1.5 times the recessed depth h of the electrode from the outer face of the passivation layer on the IC chip, as in the inventive Examples 1 to 5, whereas no better electroconductive connection can be attained by using metal particles, as in the Comparative Examples 1 and 2, due to destruction of the passivation layer.

Example 6

A glass substrate circuit board provided thereon with a plurality of electrodes of indium tin oxide (ITO) arranged in a row and an IC chip having thereon a plurality of electrodes formed as bumps arranged also in a row (50 μm×150 μm in size; at an 80 μm interval; 90 bumps) were held in opposition so as to confront their corresponding electrodes to each other under interposition of the connecting material for anisotropically electroconductive connection prepared in Example 1 therebetween. By sliding the relative position of the confronted electrodes in the direction of the electrode row, the distance between the ITO electrode of the circuit board and the bump of the IC chip neighboring that confronting the ITO electrode was altered. In this manner, a series of connected assemblies in which the above distance is varied was prepared by heat-pressing under the same condition as in Example 1. An electric voltage of 20 V was impressed between the neighboring electrodes of the assembly to detect the occurrence of short-circuiting and assess the relationship of occurrence of short-circuiting with the variation of the distance between the bump and the neighboring ITO electrode. When the detected electric resistance was lower than $10^8 \Omega$, it was assessed that a short-circuit occurred. Results are recited in Table 1.

TABLE 1

| | Bump/ITO Electrode Distance (μm) | | | | |
|---|---|---|---|---|---|
| | 0~5 | 6~10 | 11~15 | 16~20 | 21~25 |
| Occurrence (%) of short-circ. | 85 | 76 | 70 | 58 | 32 |

Example 7

The procedures of Example 6 were repeated with the exception that the electroconductive particles as used in Example 1 were coated with a thermoplastic resin based on an acrylic resin. The results are recited in Table 2.

TABLE 2

| | Bump/ITO Electrode Distance (μm) | | | | |
|---|---|---|---|---|---|
| | 0~5 | 6~10 | 11~15 | 16~20 | 21~25 |
| Occurrence (%) of short-circ. | 12 | 5 | 0 | 0 | 0 |

From the results of Examples 6 and 7, it is seen that the rate of occurrence of short-circuiting decreases below an average particle size of the electroconductive particles of 0.5 time, especially in the range of 0.2 to 0.5 time, the distance between the bump and the ITO electrode neighboring that confronted to the bump.

What is claimed is:

1. An anisotropically electroconductive connecting material for bonding and connecting a semiconductor element having a plurality of electrodes recessed from an outer face of a passivation layer formed on the semiconductor element with a substrate circuit board having a plurality of electrodes in a correspondingly confronted relation to the electrodes of the semiconductor element, comprising an adhesive component having an electrically insulating property and electroconductive particles, wherein each of the electroconductive particles comprises a resin core particle successively coated with a metal layer and an insulating resin and the average particle size of the electroconductive particles is at least 1.5 times the recessed depth of the electrodes from the outer face of the passivation layer on the semiconductor element.

2. The connecting material as claimed in claim 1, wherein the hardness of the electroconductive particles is in the range of from 500 to 10,000 N/mm$^2$.

3. The connecting material as claimed in claim 1, wherein the Mohs hardness of the metal coating layer of the electroconductive particles is in the range of from 1 to 6.

4. The connecting material as claimed in claim 1, wherein the average particle size of the electroconductive particles is at most 0.5 time the distance between adjacent electrodes.

5. An electroconductive connection structure in which a semiconductor element having a plurality of electrodes recessed from an outer face of a passivation layer formed on the semiconductor element is bonded and electroconductively connected with a substrate circuit board having a plurality of electrodes in a correspondingly confronted relation to the electrodes of the semiconductor element using an anisotropically electroconductive connection material, wherein the anisotropically electroconductive connection material comprises
an adhesive component having an electrically insulating property and
electroconductive particles,
each of the electroconductive particles comprising a resin core particle coated with a metal layer and the average particle size of the electroconductive particles is at least 1.5 times the recessed depth of the electrodes from the outer face of the passivation layer of the semiconductor element.

6. The electroconductive connection structure as claimed in claim 5, wherein the hardness of the electroconductive particles is in the range from 500 to 10,000 N/mm$^2$.

7. The electroconductive connection structure as claimed in claim 5, wherein the Mohs hardness of the metal coating layer of the electroconductive particles is in the range from 1 to 6.

8. The electroconductive connection structure as claimed in claim 5, wherein the average diameter of the electroconductive particles is at least 0.5 time the distance between adjacent electrodes.

9. The electroconductive connection structure as claimed in claim 5, wherein an insulating resin is coated on the metal layer.

* * * * *